United States Patent
Lee

(10) Patent No.: US 8,335,886 B2
(45) Date of Patent: Dec. 18, 2012

(54) WEAR LEVELING METHOD FOR NON-VOLATILE MEMORY DEVICE HAVING SINGLE AND MULTI LEVEL MEMORY CELL BLOCKS

(75) Inventor: Yang-sup Lee, Gunpo-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 446 days.

(21) Appl. No.: 12/534,358

(22) Filed: Aug. 3, 2009

(65) Prior Publication Data

US 2010/0115192 A1    May 6, 2010

(30) Foreign Application Priority Data

Nov. 5, 2008    (KR) .................. 10-2008-0109467

(51) Int. Cl.
G06F 12/00    (2006.01)
G06F 13/00    (2006.01)
G06F 13/28    (2006.01)
G11C 16/04    (2006.01)
G11C 16/06    (2006.01)

(52) U.S. Cl. .................. 711/103; 711/115; 365/185.33; 365/185.29

(58) Field of Classification Search .................. 711/103
See application file for complete search history.

(56) References Cited

U.S. PATENT DOCUMENTS

| | | | | |
|---|---|---|---|---|
| 5,930,167 A * | 7/1999 | Lee et al. | ........... | 365/185.03 |
| 7,287,118 B2 * | 10/2007 | Chang et al. | ........... | 711/103 |
| 7,545,673 B2 * | 6/2009 | Lasser | ........... | 365/185.03 |
| 2007/0061502 A1 * | 3/2007 | Lasser et al. | ........... | 711/103 |
| 2010/0064094 A1 * | 3/2010 | Yeh | ........... | 711/103 |

FOREIGN PATENT DOCUMENTS

| | | |
|---|---|---|
| JP | 11176478 A | 7/1999 |
| JP | 2001357683 A | 12/2001 |
| KR | 1020010037694 A | 5/2001 |

* cited by examiner

Primary Examiner — Yaima Campos
Assistant Examiner — Hamdy S Ahmed
(74) Attorney, Agent, or Firm — Volentine & Whitt, PLLC

(57) ABSTRACT

A method of executing a wear leveling operation within a non-volatile memory including a single-level memory cell block (SLC) and a multi-level memory cell block (MLC) is disclosed. The method includes calculating an average erase point in relation to a number of programming/erase (P/E) operations applied to a logical block address (LBA), a SLC mode usage point in relation to a number of the P/E operations applied to the SLC, a MLC mode usage point in relation to a number of the P/E operations applied to the MLC, and a wear value in relation to the average erase point, the SLC mode usage point, and the MLC mode usage point; and then if the wear value exceeds a defined threshold value, performing the wear leveling operation.

17 Claims, 3 Drawing Sheets

WEAR LEVELING METHOD FOR NON-VOLATILE MEMORY DEVICE HAVING SINGLE AND MULTI LEVEL MEMORY CELL BLOCKS

CROSS-REFERENCE TO RELATED APPLICATION

This application claims the benefit of Korean Patent Application No. 10-2008-0109467 filed on Nov. 5, 2008, the subject matter of which is hereby incorporated by reference.

BACKGROUND

The inventive concept relates generally to non-volatile memory devices. More particularly, the inventive concept relates to non-volatile memory devices including both single level and multi level memory cell blocks, wherein a wear leveling method is performed.

Due to their compact size and excellent performance characteristics, contemporary memory systems requiring repetitive reprogramming capabilities and non-volatile data storage are increasingly implemented with non-volatile memory cells, such as those found in conventional flash memory. Flash memory was initially implemented with single level memory cells configured to store one bit of information (i.e., data values of "0" and "1") using a single memory cell transistor. However, as data storage demands have increased over time, flash memory has increasingly been implemented with so-called multi level memory cells capable of storing two or more bits of information using a single memory cell transistor.

A threshold voltage distribution (Vth) for a two bit multi level memory cell having four stored data states is illustrated in Figure (FIG. 1. The four data states equate respectively to data values of "01", "00", "10", or "11". In this manner, two bits of information may be stored in the multi level memory cell. The storage capacity of the illustrated two bit, multi level memory cell essentially allows a doubling of the storage capacity of a constituent memory cell array without greatly enlarging the area occupied by the array, as compared with the use of single bit memory cells.

Unfortunately, the data programming (or write) speed of the multi level memory cell is markedly slower than that of the single level memory cell. This reduced write speed is tolerable for much of the data commonly written to a contemporary memory system, but there are certain types of data requiring frequent update that benefit from the higher write speed afforded by single level memory cells. This being the case, it is not uncommon to find memory system including both multi level and single level memory blocks. For example, certain "fast programming time" memory blocks intended to receive relatively high speed data (e.g., data requiring frequent update) are implemented with single level memory cells. In contrast, other "slow programming time" memory blocks intended to receive relatively slow speed data (e.g., bulk payload data or data not normally requiring frequent update) are implemented with multi level memory cells. In this manner, a hybrid memory system of sorts provides a large data storage capacity due to the presence of the multi level memory cell (slow) blocks and high speed data access due to the presence of the single level memory (fast) blocks.

During operation, both the fast and slow memory blocks are repeatedly programmed and erased. It is well known that only a certain number of erase operations may be executed in relation to each flash memory block and/or corresponding physical memory cells before the constituent memory cells become too worn to ensure reliable operation. In other words, the operative lifespan of each memory block is defined in terms of a maximum number of programming and/or erase cycles. For conventional multi level memory cell (slow) blocks, this maximum number is currently defined in terms of about ten thousand erase operations. For conventional single level memory cell (fast) blocks, this maximum number is defined in terms of between one hundred thousand and a million erase operations. However defined, once a flash memory block has exceeded its maximum number of use cycles, it must be withdrawn from or replaced in operation within the constituent memory system. Otherwise, the integrity of the flash memory system can not be assured and the loss of user data or host device failure becomes a very real possibility.

Thus, the "wear" placed upon a flash memory block (or the physical memory array location of memory cells functionally implementing the memory block) will vary according to its use (i.e., a number of programming, erase, etc., operations executed in relation to the memory block). Recognizing that flash memory cell wear is a function of physically exercising a memory cell (or memory cell block), it should also be recognized that any operation performed in relation to a particular memory cell is performed in relation to a so-called logic block address (LBA). The LBA is used by the host device incorporating the flash memory system to indicate one or more memory cells to be programmed or erased, for example. Assuming a static relationship between a LBA and corresponding portion of the flash memory array, repeated commands by the host device directed to the same LBA will ultimately wear the memory cells associated with the corresponding physical location.

As noted above, uneven wear of some memory cells to the point of lifespan exhaustion may well impair the performance of the entire flash memory system. That is, a single overly worn memory block may cause the memory system to fail.

In order to extend the operative life of the memory system, therefore, and to ensure that the plurality of flash memory blocks are evenly worn, a wear leveling operation is often performed. In one approach, a wear leveling operation changes the mapping relationship between a given LBA (i.e., a frequently used LBA) and the physical location of corresponding memory cells (or a memory block) within flash memory. In this manner, repeated commands to a frequently used LBA will not result in the uneven wear of memory cells in a particular physical location. By rotating physical locations under the same frequently used LBA, a collection of flash memory blocks will wear much more evenly, thereby extending the overall lifespan of the entire memory system.

SUMMARY

Embodiments of the inventive concept provide a wear leveling method operable within a non-volatile memory device including at least one single level memory cell block and a plurality of multi level memory cell blocks.

In one embodiment, a method of executing a wear leveling operation within a non-volatile memory including a single-level memory cell block (SLC) and a multi-level memory cell block (MLC) includes; calculating an average erase point in relation to a number of programming/erase (P/E) operations applied to a logical block address (LBA), a SLC mode usage point in relation to a number of the P/E operations applied to the SLC, a MLC mode usage point in relation to a number of the P/E operations applied to the MLC, and a wear value in relation to the average erase point, the SLC mode usage point, and the MLC mode usage point, and if the wear value exceeds a defined threshold value, performing the wear leveling operation.

BRIEF DESCRIPTION OF THE DRAWINGS

Exemplary embodiments of the inventive concept will be more clearly understood from the following description taken in conjunction with the accompanying drawings in which.

DESCRIPTION OF THE EMBODIMENTS

Hereinafter, exemplary embodiments of the inventive concept will be described in relation to the accompanying drawings. It should be noted, however, that the inventive concept may be variously implemented and the illustrated embodiments are intended to serve as teaching examples. Throughout the written description and drawings, like reference numbers and labels are used to refer to like or similar features.

Figure 1:
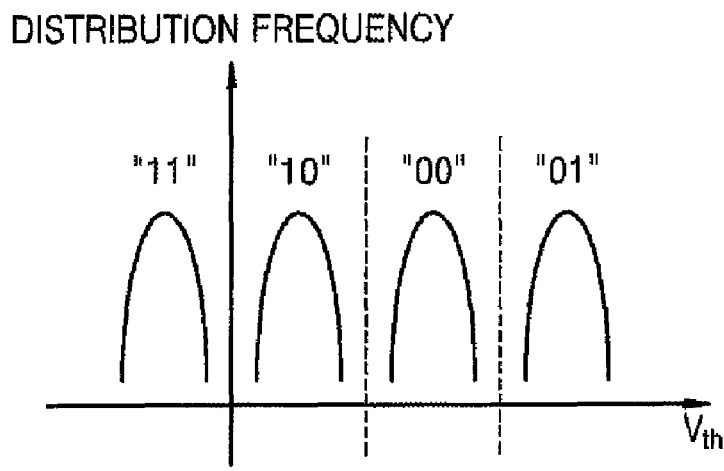
FIG. 1 is a graph showing distributions of a threshold voltage for a conventional multi level memory cell.
Figure 2:
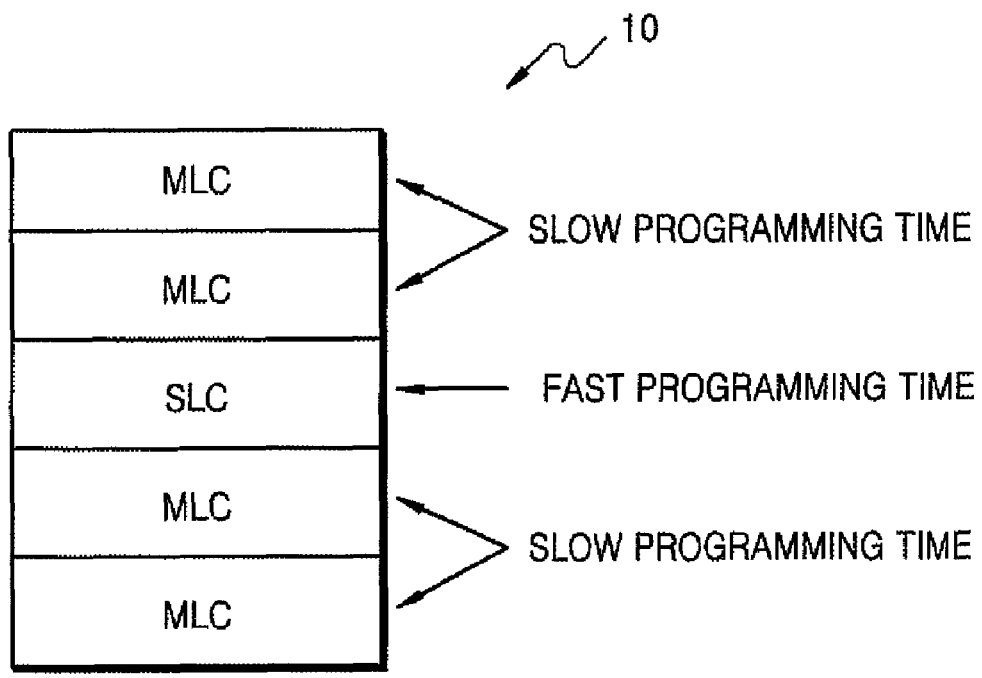
FIG. 2 illustrates a non-volatile memory device including single level memory cell blocks and multi level memory cell blocks according to an embodiment of the inventive concept.

The embodiment of a flash memory device 10 illustrated in FIG. 2 recognizes that the number of programming/erase cycles applied to the single level memory cell block (SLC) will be different from the number of programming/erase cycles applied to the multi level memory cell blocks (MLC). On the basis of this recognition, it is further recognized that a method for efficiently performing a wear leveling operation, as between the single level memory cell block and one or more of the multi level memory cell blocks is needed.

In the flash memory device 10 illustrated in FIG. 2, it is assumed that the maximum number of programming and/or erase (P/E) cycles capable of being performed in relation to the single memory cell block (SLC) is about 100K. It is further assumed that the maximum number of programming and/or erase (P/E) cycles capable of being performed in relation to any one of the plurality of multi level memory cell blocks (MLCs) is about 10K.

Figure 3A:
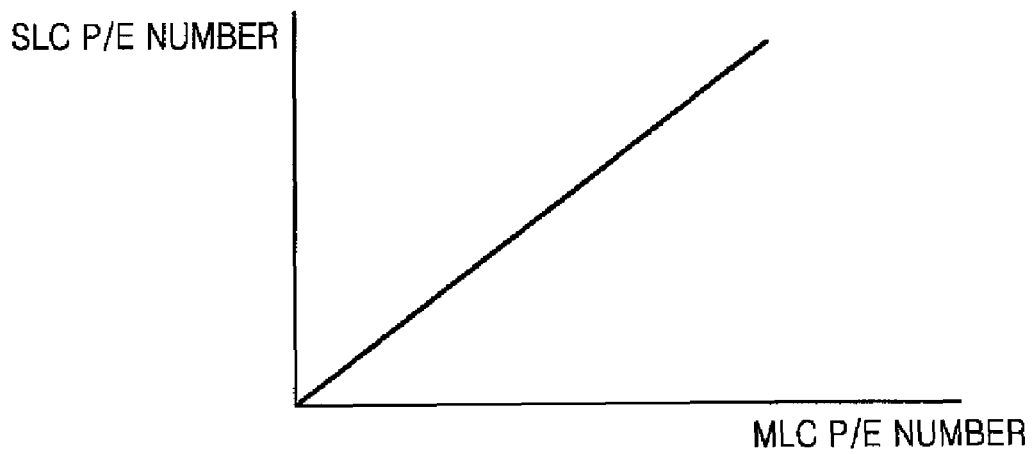
FIGS. 3A and 3B are graphs illustrating a degree of wear for single level memory cell blocks and multi level memory cell blocks in relation to a number of programming and erasing cycles in accordance with an embodiment of the inventive concept.
Figure 3B:
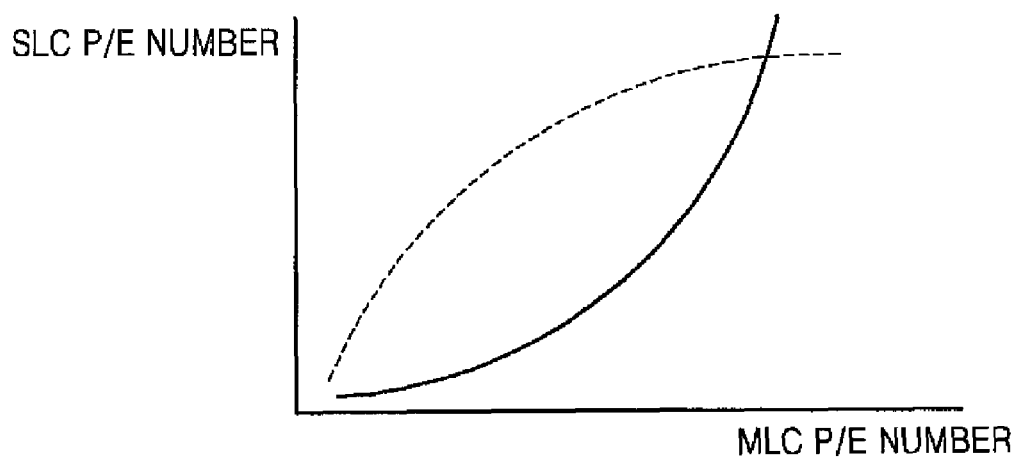

Under these illustrative assumptions, the degree of wear for the SLC and MLCs with regard to a number of performed P/E cycles is first deemed to be quantitatively linear in relationship, as illustrated in FIG. 3A. However, the degree of wear for the SLC and MLCs with regard to the number of performed P/E cycles may, in fact, be qualitatively non-linear in relationship, as shown in FIG. 3B. Recognizing these two possible relationships, one competent wear leveling method according to an embodiment of the invention concept and performed in relation to the SLC and MLCs of FIG. 2 is illustrated in FIG. 4.

Figure 4:
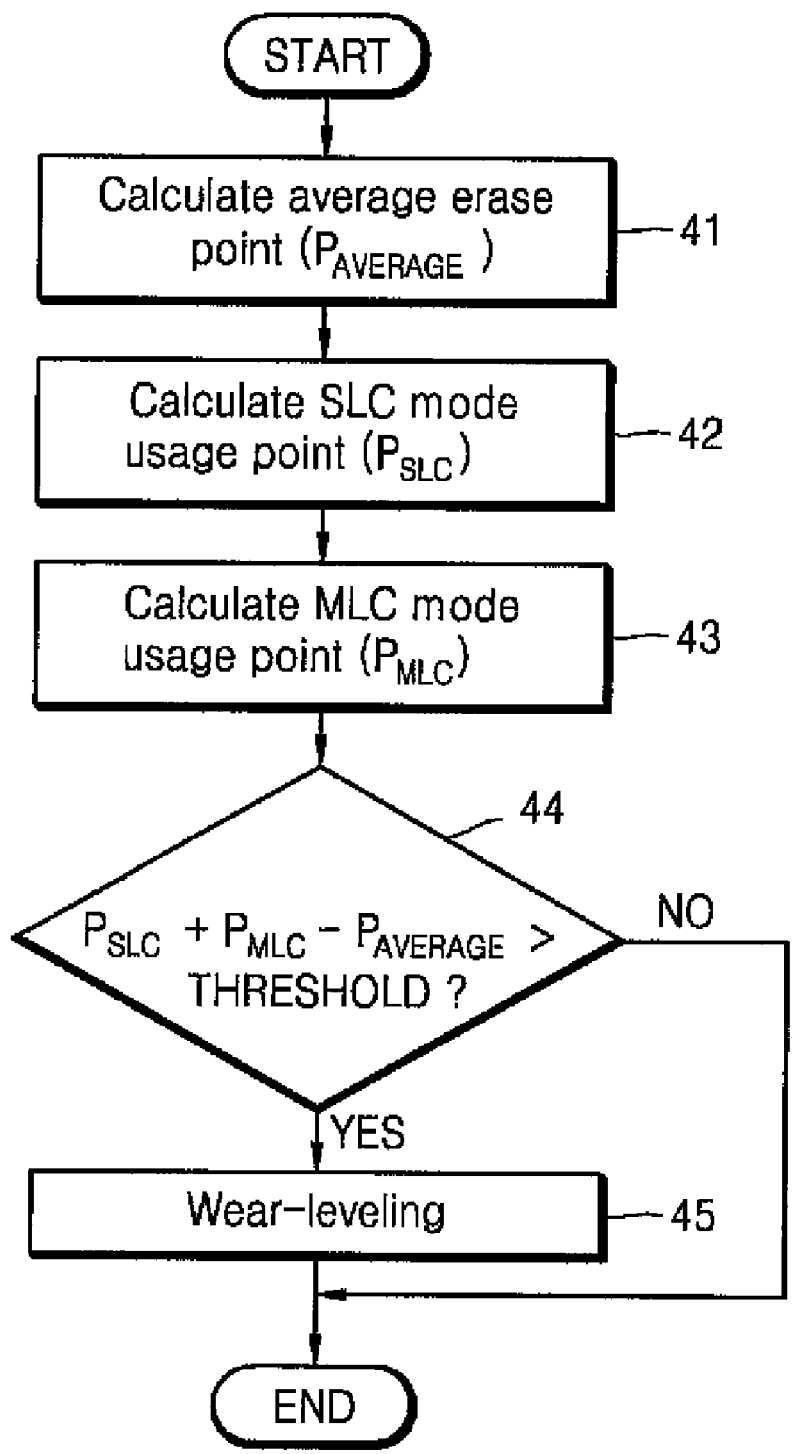
FIG. 4 is a flowchart illustrating a wear leveling method performed with regard to the single level memory cell blocks and multi level memory cell blocks according to an embodiment of the inventive concept.

Referring to FIG. 4, the wear level method begins by calculating an average erase point ($P_{AVERAGE}$) associated with a number of applied erase operations for each memory cell block, including the SLC and MLCs (41). Next, a SLC mode usage point ($P_{SLC}$) is calculated in relation to the number of P/E cycles applied to the SLC (42). Then, a MLC mode usage point ($P_{MLC}$) is calculated in relation to the number of P/E cycles applied to each MLC, or an average number (or an estimated number) of P/E cycles determined for the group of MLCs (43). For example, the MLC mode usage point $P_{MLC}$ may be obtained by multiplying the actual number of P/E cycles applied to the SLC by some estimate factor "N" to estimate the numbers of P/E cycles applied to the MLCs. Under the foregoing assumptions, for example, if the number of P/E cycles applied to the SLC is about 100K, then the number of applied P/E cycles applied to any one of the MLCs is estimated to be about 10K, assuming the estimate factor N is 10.

Having obtained the average erase point ($P_{AVERAGE}$), the SLC mode usage point ($P_{SLC}$), and the MLC mode usage point ($P_{MLC}$), a threshold comparison is made (44). In the illustrated embodiment, this threshold comparison is made by adding the SLC mode usage point ($P_{SLC}$) and the MLC mode usage point ($P_{MLC}$) and then subtracting the average erase point ($P_{AVERAGE}$)

If the resulting "wear value" exceeds defined the threshold value (44=yes), then a wear levelling operation is performed (45). That is, (e.g.) an existing mapping relationship between one or more LBAs and corresponding physical locations for memory cells with the memory system is changed (i.e., a "new logical/physical memory block relationship is defined). For example, if the number of the P/E cycle of MLCs reaches the maximum number of the P/E cycle of MLCs, the SLCs are only used instead of the MLCs. Otherwise (44=no), the non-volatile memory system continues operating with its current set of logical/physical memory block relationships.

A particular threshold value used for this foregoing comparison may be determined in relation to a number of programming and erase operations (or cycles) over which the functional performance properties for a memory block including constituent single level memory cells and a memory block including constituent multi-level memory cells are essentially the same. That is, the operating limitations and properties for memory blocks comprising single level memory cells and multi-level memory cells are taken into consideration. Clearly, multiple threshold values (or a composite threshold value) may be defined and compared in determining the need for execution of a wear leveling operation within the memory system.

The P/E cycles considered above may be defined in relation to one or more LBAs. Thus, if a particular physical location associated with a memory block indicated by a particular LBA exceeds a currently defined threshold value, a competent wear leveling operation may be timely executed in relation to at least this physical location in order to avoid uneven memory block wear. This outcome follows, regardless of whether the SLC or an MLC is implicated by the LBA.

It should be noted that only a single SLC is shown in the embodiment of FIG. 2, but this need not be the case for all embodiments of the inventive concept. Further, three bit and higher multi level memory cells are subject to the benefits described above in relation to an example assuming two bit multi level memory cells.

Accordingly to the foregoing, any competent wear leveling method may be executed within embodiments of the inventive concept to avoid uneven memory block wear, regardless of the fact that both at least one SLC memory block and a plurality of MLC memory blocks are exercised by a number of applied P/E cycles. This wear leveling method is executed in relation to a number of operations defined by the end user, and typically including programming and/or erase (P/E) operations.

While the inventive concept has been particularly shown and described with reference to exemplary embodiments thereof, it will be understood that various changes in form and details may be made therein without departing from the scope of the following claims.

What is claimed is:

1. A method comprising: calculating an average erase point in relation to a number of erase operations for each of a plurality of memory cell blocks including a single-level memory cell block (SLC) and a multi-level memory cell block (MLC);
   calculating a SLC mode usage point in relation to a number of program/erase (P/E) operations applied to a physical memory block corresponding to a logical block address (LBA);
   calculating an MLC mode usage point in relation to a number of the P/E operations applied to the physical memory block;
   calculating a wear value by using the SLC mode usage point, the MLC mode usage point and the average erase point; and
   performing a wear leveling operation, when the wear value exceeds a defined threshold value.

2. The method of claim 1, the wear value is calculated by adding the SLC mode usage point and the MLC mode usage point, and subtracting the average erase point.

3. The method of claim 1, wherein calculating the MLC mode usage point is done by performing an estimation in relation to the number of the P/E operations applied to the SLC.

4. The method of claim 3, wherein the estimation is performed by multiplying the number of the P/E operations applied to the SLC by a predetermined factor.

5. The method of claim 1, wherein the wear leveling operation changes a mapping relationship between the LBA and a corresponding physical location of memory cells in the non-volatile memory.

6. The method of claim 1, wherein the MLC mode usage point reaches to a maximum number of the MLC mode usage point, and the SLC is used instead of the MLC.

7. A method of executing a wear leveling operation within a non- volatile memory, the method comprising:
   calculating an average erase point in relation to a number of erase operations for each of a plurality of memory cell blocks including a single-level memory cell block (SLC) and a multi-level memory cell block (MLC), and calculating a SLC mode usage point in relation to a number of programming/erase (P/E) operations applied to the SLC, a MLC mode usage point in relation to a number of the P/E operations applied to the MLC, and a wear value using the average erase point, the SLC mode usage point, and the MLC mode usage point associated with at least one logical block address (LBA); and
   performing the wear leveling operation, when the wear value exceeds a defined threshold value.

8. The method of claim 7, wherein the wear value is calculated by adding the SLC mode usage point and the MLC mode usage point, and subtracting the average erase point.

9. The method of claim 7, wherein calculating the MLC mode usage point is done by performing an estimation in relation to the number of the P/E operations applied to the SLC.

10. The method of claim 7, wherein the estimation is performed by multiplying the number of the P/E operations applied to the SLC by a predetermined factor.

11. The method of claim 7, wherein the wear leveling operation changes a mapping relationship between the LBA and a corresponding physical location of memory cells in the non-volatile memory.

12. A method of wear leveling operation between a plurality of memory blocks included in a nonvolatile memory device, each of the plurality of memory blocks being used as either a single-level memory cell (SLC) or a multi-level memory cell (MLC), comprising:
   calculating an MLC mode usage point in relation to a number of program/erase P/E operations applied to a physical memory block corresponding to a logical block address (LBA);
   calculating a wear value for the physical memory block using an SLC mode usage point, the MLC mode usage point and an average erase point, the SLC mode usage point being in relation to a number of program/erase (P/E) operations that the physical memory block is used as the SLC and the average erase point being relation to a number of erase operations for each of the plurality of memory cell blocks;
   performing the wear leveling operation when the wear value exceeds a defined threshold value; and
   changing a mapping relationship so that the LBA designates a different one of the plurality of memory blocks which is not the at least one of the plurality of memory blocks.

13. The method of claim 12, the wear value is calculated by adding the number of P/E operations as the SLC and the number of P/E operations as the MLC, and subtracting the average erase point.

14. The method of claim 12, the wear leveling operation includes when the at least one memory block is used by the number of P/E operation for as the MLC that reaches a maximum number of P/E operations of the MLC, the at least one memory block will be used as the SLC.

15. The method of claim 12, wherein when the at least one memory block of the plurality of memory blocks is used as the SLC, each memory cell in the at least memory block stores single data into itself.

16. The method of claim 12, wherein when the at least one memory block of the plurality of memory blocks is used as the MLC, each memory cell in the at least memory block stores multi-data into itself.

17. The method of claim 12, the data stored in the SLC is more frequently updated than the data stored in the MLC.

* * * * *